(12) United States Patent
Miki et al.

(10) Patent No.: US 7,276,887 B2
(45) Date of Patent: Oct. 2, 2007

(54) POWER SUPPLY CIRCUIT

(75) Inventors: Takeshi Miki, Okazaki (JP); Mitsuhiro Kanayama, Takahama (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/491,984

(22) Filed: Jul. 25, 2006

(65) Prior Publication Data

US 2007/0018711 A1 Jan. 25, 2007

(30) Foreign Application Priority Data

Jul. 25, 2005 (JP) ............................ 2005-214525

(51) Int. Cl.
*G05F 1/46* (2006.01)
*H02M 1/10* (2006.01)

(52) U.S. Cl. .......................... 323/269; 307/80; 307/86; 363/142

(58) Field of Classification Search ................ 323/268, 323/269, 273, 274, 281, 303; 363/142; 307/80, 307/85, 86

See application file for complete search history.

(56) References Cited

U.S. PATENT DOCUMENTS

| 4,456,833 | A | * | 6/1984 | Traub et al. .................. 307/80 |
| 5,703,415 | A | * | 12/1997 | Tanaka .......................... 307/66 |
| 5,973,484 | A | * | 10/1999 | Cho ............................ 323/269 |
| 6,400,589 | B2 | | 6/2002 | Abo et al. |
| 6,404,076 | B1 | * | 6/2002 | Matsuda et al. ............... 307/80 |
| 6,712,923 | B2 | | 3/2004 | Tanaka |
| 7,002,329 | B2 | | 2/2006 | Agari et al. |
| 7,038,522 | B2 | * | 5/2006 | Fauh et al. .................. 327/407 |
| 2005/0088856 | A1 | | 4/2005 | Yamamoto et al. |

FOREIGN PATENT DOCUMENTS

JP          A-63-296113          12/1988

* cited by examiner

*Primary Examiner*—Gary L Laxton
(74) *Attorney, Agent, or Firm*—Posz Law Group, PLC

(57) ABSTRACT

A power supply circuit includes first and second power supply circuits. The first power supply circuit has a first voltage generation circuit and the second power supply circuit has a second voltage generation circuit and an operational amplifier. When a load is in a low power consumption mode, only the first power supply circuit operates to output a first voltage to the load. When the load is in a normal operation mode, the second power supply circuit also operates to output a desired power supply voltage based on a reference voltage generated by the second voltage generation circuit. In this case, the operational amplifier controls not only the second power supply circuit but also the first power supply circuit. Thus, a desired power supply voltage is output to the load regardless of whether the first voltage is greater than the desired power supply voltage.

7 Claims, 7 Drawing Sheets

POWER SUPPLY CIRCUIT

CROSS REFERENCE TO RELATED APPLICATION

This application is based on and incorporates herein by reference Japanese Patent Application No. 2005-214525 filed on Jul. 25, 2005.

FIELD OF THE INVENTION

The present invention relates to a power supply circuit having two different power supply circuits.

BACKGROUND OF THE INVENTION

An electronic control unit (ECU) used in a vehicle is powered by a voltage supplied from a power supply circuit. When a switch such as an ignition switch, a key switch, or a main power switch of the vehicle is in an ON position, the ECU operates in a normal operation mode. Therefore, the power supply circuit needs to output an enough current (e.g., hundreds of milliamperes) to allow the ECU to operate in the normal operation mode. In contrast, when the ignition switch is in an OFF position, the ECU operates in a low power consumption mode. Therefore, the output current from the power supply circuit is very small.

The power supply circuit includes a high accuracy power supply circuit used in the normal operation mode and a low accuracy power supply circuit used in the low power consumption mode. Although the high accuracy power supply circuit requires a large current, the high accuracy power supply circuit generates an accurately regulated voltage by using, for example, a bandgap reference circuit. In contrast, although the low accuracy power supply circuit requires a small current, the low accuracy power supply circuit generates a poorly regulated voltage by using, for example, a zener diode. Thus, a current (i.e., dark current) consumed when the ignition switch is in the OFF position is reduced.

U.S. Pat. No. 6,400,589 corresponding to JP-A-2001-268787 discloses a power supply circuit having a main DC-DC converter and a sub DC-DC converter. When the ignition switch is in the OFF position, the main DC-DC converter is turned off and only the sub DC-DC converter operates to supply a dark current to a low voltage load. When the ignition switch is in the ON position, the main DC-DC converter is turned on and supplies a required power and the sub DC-DC converter supplies the dark current.

FIG. 7 shows a circuit diagram of a conventional power supply integrated circuit (IC) 1. The conventional power supply IC 1 includes a low-accuracy power supply circuit 2 and a high-accuracy power supply circuit 3.

The low-accuracy power supply circuit 2 is powered by a battery voltage VBAT and includes a voltage generation circuit 5 and an emitter follower circuit 6. The voltage generation circuit 5 has a constant current circuit 4, a diode D1, and a zener diode D2, which are connected in series. The emitter follower circuit 6 has transistors Q1, Q2.

The high-accuracy power supply circuit 3 is powered by a battery voltage VB supplied through an ignition switch and includes a bandgap reference circuit 7 and a voltage output circuit 8. The voltage output circuit 8 has an operational amplifier 9, a feedback circuit 10, and a transistor Q3.

In the conventional power supply IC 1, when the ignition switch is in the OFF position, only the low-accuracy power supply circuit 2 operates. Therefore, a voltage Vo output from the conventional power supply IC 1 is given by the following equation:

$$Vo = Vz - VF$$

In the equation, Vz represents a zener voltage of the zener diode D2 and VF represents a forward voltage of a PN junction.

When the ignition switch is in the ON position, each of the low-accuracy power supply circuit 2 and the high-accuracy power supply circuit 3 operates. The high-accuracy power supply circuit 3 performs a feedback control that maintains the output voltage Vo at a constant level, for example, 5 volts (V). Therefore, when the zener voltage Vz minus the forward voltage VF is less than 5 V (i.e., Vz−VF<5 V), the high-accuracy power supply circuit 3 mainly works to maintain the output voltage Vo at 5 V. In contrast, when the zener voltage Vz minus the forward voltage VF is greater than 5 V (i.e., Vz−VF>5 V) and a current output from a terminal 1a of the conventional power supply IC 1 is small, the low-accuracy power supply circuit 2 mainly works. Consequently, the output voltage Vo is the zener voltage Vz minus the forward voltage VF (i.e., Vo=Vz−VF>5 V). Because the low-accuracy power supply circuit 2 has a low capability to output the current, the output voltage Vo decreases with an increase in the output current due to an increase in a load. Therefore, the output voltage Vo decreases to 5 V and is maintained at 5 V by the high-accuracy power supply circuit 3.

As described above, when the zener voltage Vz minus the forward voltage VF is greater than 5 V, the conventional power supply IC 1 falls into an unstable condition where the output voltage Vo varies with the output current.

Therefore, the conventional power supply IC 1 is configured such that the zener voltage Vz minus the forward voltage VF is lower than 5 V, i.e., the output voltage of the low-accuracy power supply circuit 2 is lower than that of the high-accuracy power supply circuit 3. Further, when manufacturing and temperature variations in the zener voltage Vz are considered, the output voltage Vo that is output when the ignition switch is in the OFF position needs to be set lower than 5 V.

SUMMARY OF THE INVENTION

In view of the above-described problem, it is an object of the present invention to provide a power supply circuit capable of outputting a desired stable power supply voltage.

A power supply circuit is supplied with at least one of a first power voltage and a second power voltage from an external power source and outputs a desired power supply voltage. The power supply circuit includes a first power supply circuit powered by the first power voltage, a second power supply circuit powered by the second power voltage, a current sink circuit, and an output terminal shared between the first and second power supply circuit. The first power supply circuit includes a first voltage generation circuit for outputting a first output voltage that changes with an output current from the first voltage generation circuit and a first output circuit for outputting a second output voltage based on the first output voltage to the shared output terminal. The second power supply circuit includes a second voltage generation circuit for outputting a third output voltage, a differential amplifier circuit for outputting a fourth output voltage based on a difference between the third output voltage and a feedback voltage from the output terminal, and a second output circuit for outputting a fifth output voltage based on the fourth output voltage to the shared output terminal. The output current from the first voltage generation circuit flows into the current sink circuit based on the fourth output voltage.

When the power supply circuit is supplied with only the first power voltage, the second power supply circuit stops and the output current from the first voltage generation circuit does not flow into the current sink circuit. Because an output current from the power supply circuit is small, a change in the first output voltage is small. Thus, the second output voltage output from the output terminal is maintained at an approximately constant value.

In contrast, when the power supply circuit is supplied with the first and second power voltages, each of the first and second power supply circuits operates. The differential amplifier circuit outputs the fourth output voltage to the second output circuit based on the difference between the third output voltage and the feedback voltage from the output terminal. The fourth output voltage allows the second output circuit to output the fifth output voltage that is equal to the desired power supply voltage. In this case, if the second output voltage from the first output circuit is lower than the desired power supply voltage, the first power supply circuit essentially stops and only the second power supply circuit operates. In contrast, if the second output voltage is greater than the desired power supply voltage, the output current flowing into the current sink circuit increases due to a change in the fourth output voltage that is feedback controlled by the differential amplifier circuit. The first output voltage from the first voltage generation circuit decreases with the increases in the output current flowing into the current sink circuit. Thus, the differential amplifier circuit controls each of the first and second power supply circuits to allow a voltage of the output terminal to equal the desired power supply voltage. Therefore, the power supply circuit can stably output the desired power supply voltage regardless of whether the first output voltage is greater than the desired power supply voltage.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
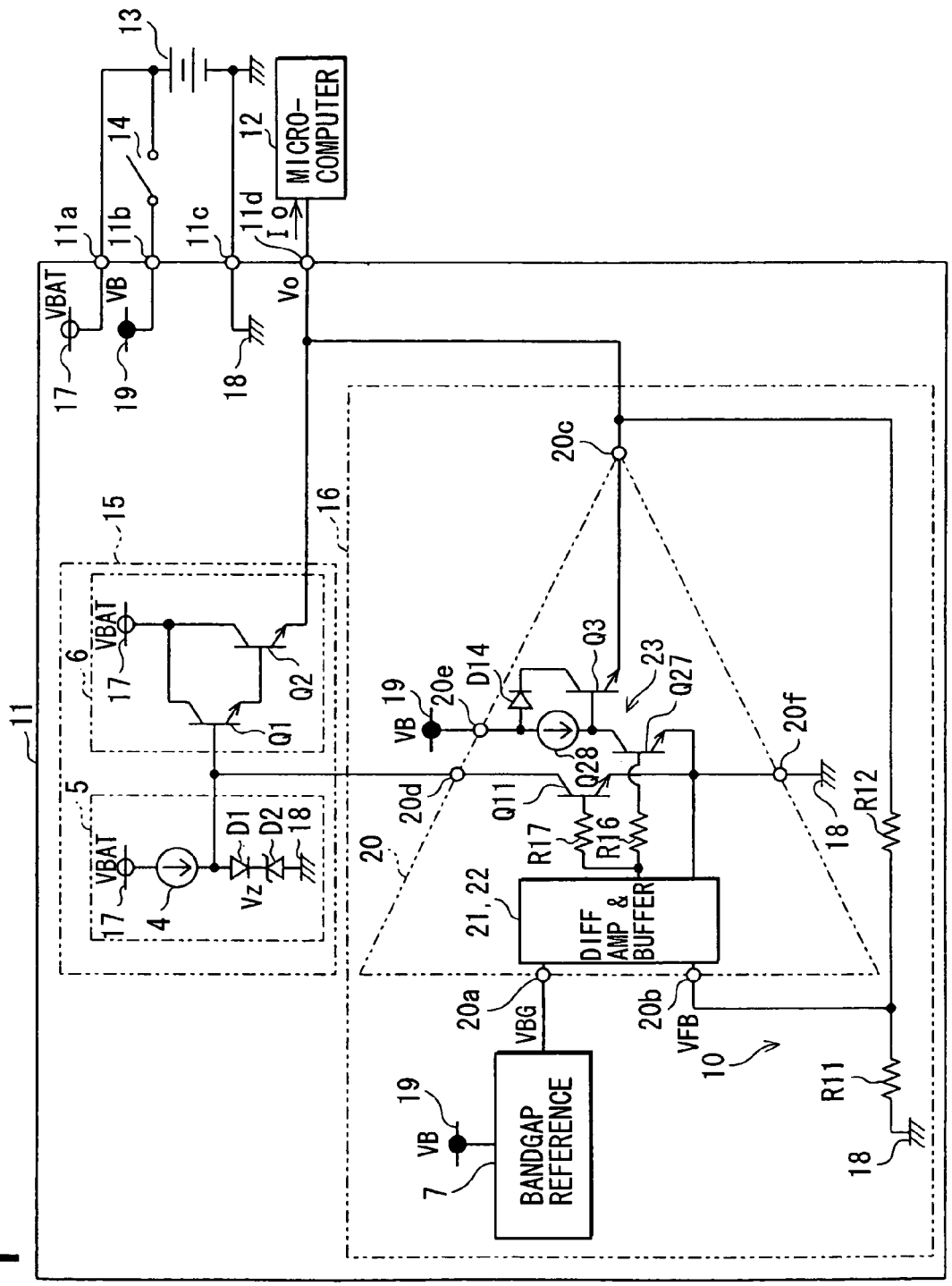
FIG. 1 is a circuit diagram of a power supply IC according to a first embodiment of the present invention.

Referring to FIGS. 1-3C, a power supply IC 11 according to a first embodiment of the present invention is described.

The power supply IC 11 is used in an ECU (not shown) of a vehicle and supplies a constant voltage, for example 5 V, to a microcomputer 12.

The power supply IC 11 has terminals 11a-11d. A battery 13 constantly supplies a battery voltage VBAT to the terminal 11a and supplies a battery voltage VB to the terminal 11b through a switch 14 such as an ignition switch, a key switch, or a main power switch. The terminal 11c is a ground terminal and the terminal 11d is an output terminal. The microcomputer 12 operates in a low power consumption mode (i.e., sleep mode or standby mode) when the switch 14 is in the OFF position and operates in a normal operation mode when the switch 14 is in the ON position.

The power supply IC 11 includes a first power supply circuit 15 and a second power supply circuit 16.

The first power supply circuit 15 is supplied with the battery voltage VBAT through a power supply line 17 and a ground line 18. The power supply line 17 and the ground line 18 are connected to the terminals 11a, 11c, respectively. The first power supply circuit 15 mainly operates when the switch 14 is in the OFF position. The first power supply circuit 15 uses a zener voltage Vz to generate a voltage. As compared to the second power supply circuit 16, the first power supply circuit 15 requires a small current and generates an accurately regulated voltage.

The second power supply circuit 16 is supplied with the battery voltage VB through a power supply line 19 and the ground line 18. The power supply line 19 is connected to the terminal 11b. The second power supply circuit 16 mainly operates when the switch 14 is in the ON position. The second power supply circuit 16 uses a bandgap reference voltage VBG to generate a voltage. As compared to the first power supply circuit 15, the second power supply circuit 16 requires a large current and generates a poorly regulated voltage.

The first power supply circuit 15 includes a voltage generation circuit 5 (as a first voltage generation circuit) and an emitter follower circuit 6 (as a first output circuit). The voltage generation circuit 5 has a constant current circuit 4, a diode D1, and a zener diode D2, which are connected in series between the power supply line 17 and the ground line 18. An anode of the diode D1 is an output node of the voltage generation circuit 5. The emitter follower circuit 6 has transistors Q1, Q2 that are connected in a Darlington configuration. Each of the transistors Q1, Q2 has a collector connected to the power supply line 17 and the transistor Q2 has an emitter connected to the terminal 11d.

Figure 2:
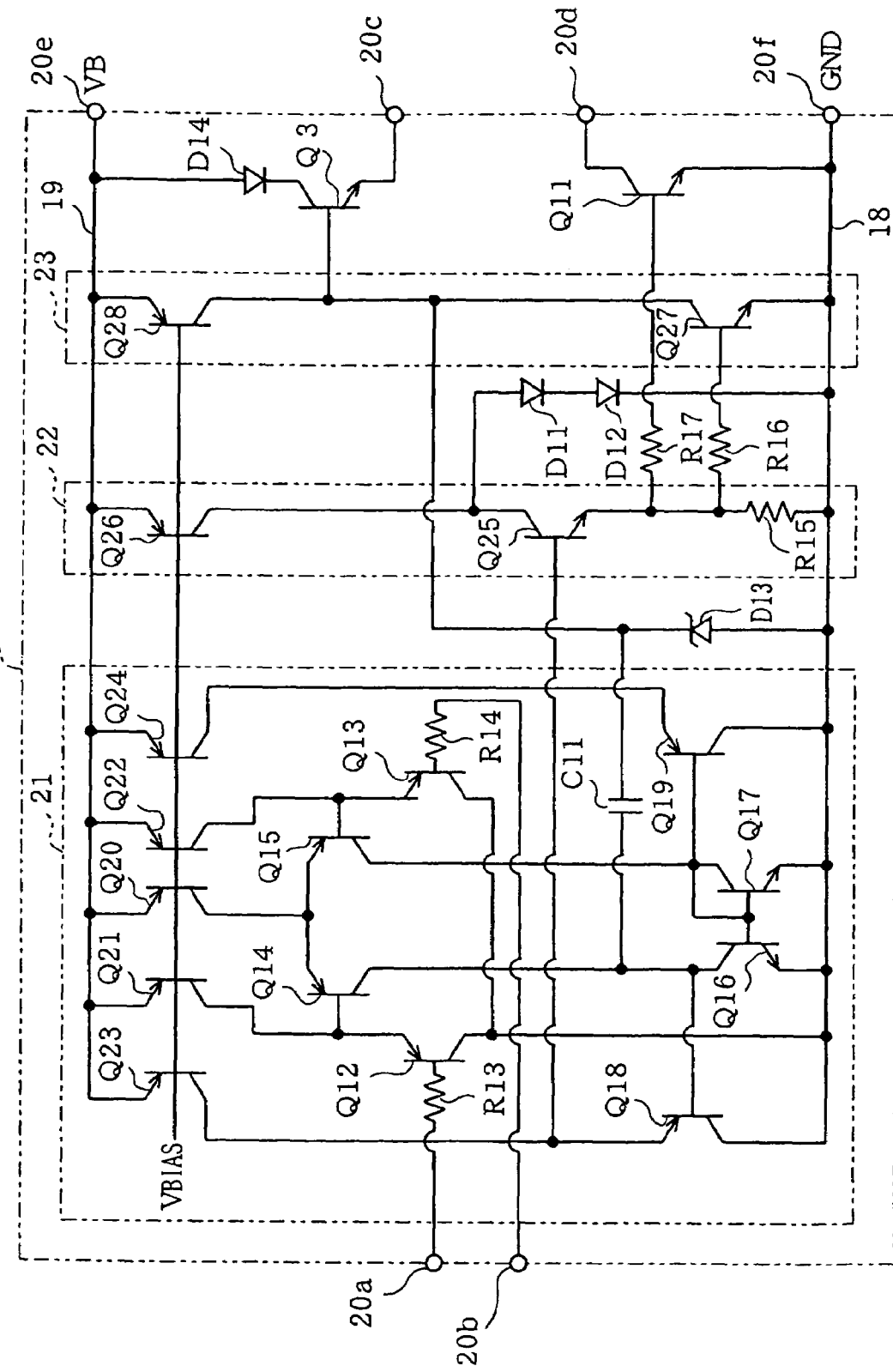
FIG. 2 is a circuit diagram of an operational amplifier used in the power supply IC of FIG. 1.

The second power supply circuit 16 includes a bandgap reference circuit 7 (as a second voltage generation circuit), an operational amplifier (op-amp) 20, and a feedback circuit 10. The bandgap reference circuit 7 has an amplifier circuit (not shown) and generates a high-accuracy reference voltage VBG of 1 V. As shown in FIG. 2, the op-amp 20 has a differential amplifier circuit 21, a buffer circuit 22, a voltage amplifier circuit 23, and output transistors Q3 (as a second output circuit), Q11 (as a current sink circuit).

The op-amp 20 has a non-inverting input terminal 20a, an inverting input terminal 20b, and an output terminal 20c. The non-inverting input terminal 20a is connected to an output terminal of the bandgap reference circuit 7. A resistor R11 is connected between the inverting input terminal 20b and the ground line 18. A resistor R12 is connected between the inverting input terminal 20b and the output terminal 20c. The ratio of the resistor R12 to the resistor R11 is four to one. Thus, a non-inverting amplifier circuit having a gain of 5 is constructed.

A configuration of the op-amp 20 is described in detail with reference to FIG. 2.

The differential amplifier circuit 21 includes differential input transistors Q12-Q15, transistors Q16-Q19 configured as an active load, transistors Q20-Q24 configured as a constant current circuit that is based on a bias voltage VBIAS, and resistors R13, R14. The resistor R13 is connected between the non-inverting input terminal 20a and the base of the transistor Q12. The resistor R14 is connected between the inverting input terminal 20b and the base of the transistor Q13. Each of the transistors Q12, Q13 has a collector connected to the ground line 18 and serves to reduce an input bias current of the op-amp 20. The transistors Q18, Q19 serve as a base current compensation circuit that supplies a base current to the transistors Q16, Q17.

The transistor Q18 has an emitter as an output node of the differential amplifier circuit 21. The emitter of the transistor Q18 is connected to the base of the transistor Q25 that is configured as an emitter-follower circuit in the buffer circuit 22.

The transistor Q25 has an emitter as an output node of the buffer circuit 22. The emitter of the transistor Q25 is connected to the ground line 18 through a resistor R15, connected to the base of a transistor Q27 of the voltage amplifier circuit 23 through a resistor R16, and connected to the base of the transistor Q11 through a resistor R17. The transistor Q25 has a collector connected to the power supply line 19 through the transistor Q26 configured as the constant current circuit. Diodes D11, D12 are connected in series between the collector of the transistor Q26 and the ground line 18 to prevent the transistor Q26 from being saturated.

The voltage amplifier circuit 23 includes the transistor Q27 and a transistor Q28 that is connected in series with the transistor Q27 and configured as the constant current circuit. The transistor Q27 has a collector as an output node of the voltage amplifier circuit 23. The collector of the transistor Q27 is connected to the base of the transistor Q3. A phase compensation capacitor C11 is connected between the collector of the transistor Q27 and the collector of the transistor Q16. A zener diode D13 is connected between an output node of the voltage amplifier circuit 23 and the ground line 18 to protect the capacitor C11.

The transistor Q3 (as a second output circuit) is configured as an emitter follower circuit. The transistor Q3 has a collector connected to the power supply line 19 through a diode D14 and has an emitter connected to the terminal 11d of the power supply IC 11 through the output terminal 20c of the op-amp 20.

The transistor Q11 (as a current sink circuit) has a collector connected to the output node of the voltage generation circuit 5 through a terminal 20d of the op-amp 20. The op-amp 20 is supplied with the battery voltage VB through terminals 20e, 20f.

The power supply IC 11 operates in the following manner.

When the switch 14 is in the OFF position, the ECU operates in such a manner that a consumption current (i.e., dark current) is reduced as much as possible. Thus, even when the vehicle is not used for a long time, the battery 13 of the vehicle is prevented from being over-discharged. In this case, the microcomputer 12 changes to the low power consumption mode (i.e., sleep mode or standby mode) where the consumption current decreases to about a few milliamperes. Accordingly, the power supply IC 11 stops the operation of the second power supply circuit 16 to reduce the consumption current. Because the bandgap reference circuit 7 and the op-amp 20, which are included in the second power supply circuit 16, require a relatively large current, the consumption current can be reduced by stopping the operation of the second power supply circuit 16.

Even in the low power consumption mode, the first power supply circuit 15 is supplied with the battery voltage VBAT and continues to operate. When a very small current of about tens of microamperes flows through the zener diode D2, the first power supply circuit 15 outputs the zener voltage Vz minus a forward voltage VF. Therefore, the current consumed in the first power supply circuit 15 is very small as compared to in the second power supply circuit 16. However, a current lo output from the power supply IC 11 increases with an increase in a base current flowing from the voltage generation circuit 5 to the emitter follower circuit 6. Accordingly, a current flowing through the zener diode D2 decreases and the zener voltage Vz decreases. Therefore, the first power supply circuit 15 is suitable for use in the low power consumption mode.

When the switch 14 is turned on, the microcomputer 12 changes to the normal operation mode where the consumption current increases to about hundreds of milliamperes. Because the power supply IC 11 is supplied with the battery voltage VB, the second power supply circuit 16 starts to operate. In the normal operation mode, thus, each of the first power supply circuit 15 and the second power supply circuit 16 operates. The op-amp 20 controls not only the second power supply circuit 16 and also the first power supply circuit 15.

In the op-amp 20, the differential amplifier circuit 21 amplifies a difference between the reference voltage VBG of 1 V and a feedback voltage VFB that is generated by dividing the output voltage Vo with the resistors R11, R12. An output voltage from the differential amplifier circuit 21 is supplied to the base of the transistor Q3 through the buffer circuit 22 and the voltage amplifier circuit 23 and also supplied to the base of the transistor Q11 through the buffer circuit 22.

When the output voltage Vo decreases below 5 V, a voltage appearing at the output node (i.e., the emitter of the transistor Q25) of the buffer circuit 22 decreases and a collector current of the transistor Q11 decreases. And at the same time a voltage appearing at the output node (i.e., the collector of the transistor Q27) of the voltage amplifier circuit 23 increases and the base voltage of the transistor Q3 increases. As a result, in the first power supply circuit 15, the current flowing from the voltage generation circuit 5 to the transistor Q11 decreases and the current flowing through the zener diode D2 increases. Thus, the first power supply circuit 15 operates such that the output voltage Vo increases. The second power supply circuit 16 also operates such that the output voltage Vo increases, because a collector-to-emitter voltage of the transistor Q3 decreases.

In contrast, when the output voltage Vo exceeds 5 V, the voltage appearing at the output node of the buffer circuit 22 increases and the collector current of the transistor Q11 increases. And at the same time, the voltage appearing at the output node of the voltage amplifier circuit 23 decreases and the base voltage of the transistor Q3 decreases. As a result, in the first power supply circuit 15, the current flowing from the voltage generation circuit 5 to the transistor Q11 increases and the current flowing through the zener diode D2 decreases. Thus, the first power supply circuit 15 operates such that the output voltage Vo decreases. The second power supply circuit 16 also operates such that the output voltage Vo decreases, because the collector-to-emitter voltage of the transistor Q3 increases.

In the normal operation mode, thus, the output voltage Vo is maintained at 5 V by the feedback control, regardless of whether the zener voltage Vz minus the forward voltage VF is greater than 5 V. The feedback control is described below separately for each case.

(1) Case 1: Vs−VF<5 V

The second power supply circuit 16 performs the feedback control that maintains the output voltage Vo at 5 V and the op-amp 20 of the second power supply circuit 16 controls the first power supply circuit 15 through the transistor Q11. In this case, because the emitter voltage of the transistor Q2 exceeds the zener voltage Vz minus the forward voltage VF, a voltage 2VF required to turn on the transistors Q1, Q2 is not applied between the base of the transistor Q1 and the emitter of the transistor Q2. Therefore, the emitter follower circuit 6 is essentially turned off and only the second power supply circuit 16 operates. Thus, the voltage Vo output from the power supply IC 11 to the microcomputer 12 is highly regulated at 5 V.

(2) Case 2: Vz−VF>5 V

When the output voltage Vo exceeds 5 V due to the first power supply circuit 15, the op-amp 20 causes the current flowing through the transistor Q11 to increase. Therefore, the current flowing though the zener diode D2 decreases and the output voltage from the first power supply circuit 15 decreases. Further, because the output current Io from the power supply IC 11 increases to about hundreds of milliamperes during a period when the switch 14 is in the ON position, the output voltage from the first power supply circuit 15 decreases also due to the output current Io. Thus, the voltage Vo output from the power supply IC 11 to the microcomputer 12 is highly regulated at 5 V.

Figure 3A:
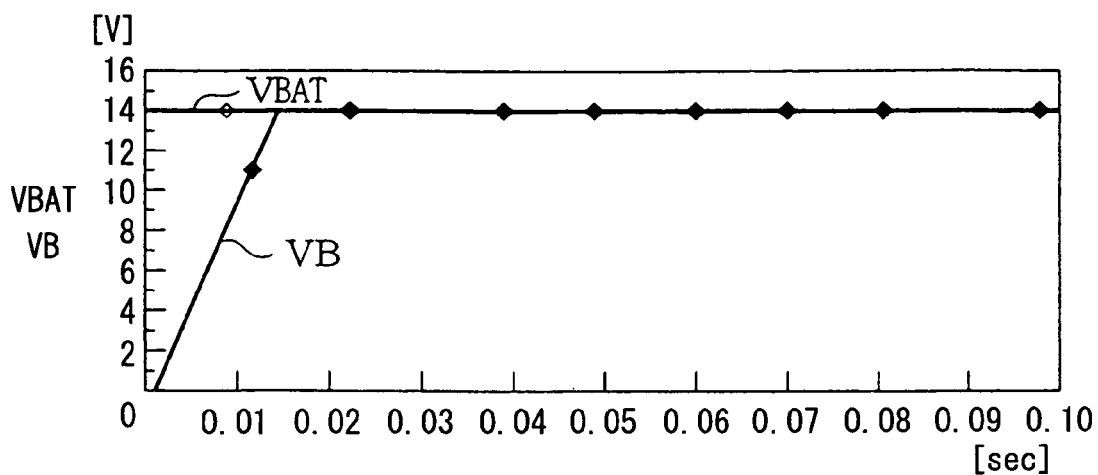
FIGS. 3A-3C are graphs illustrating simulation results of the power supply IC of FIG. 1.
Figure 3B:
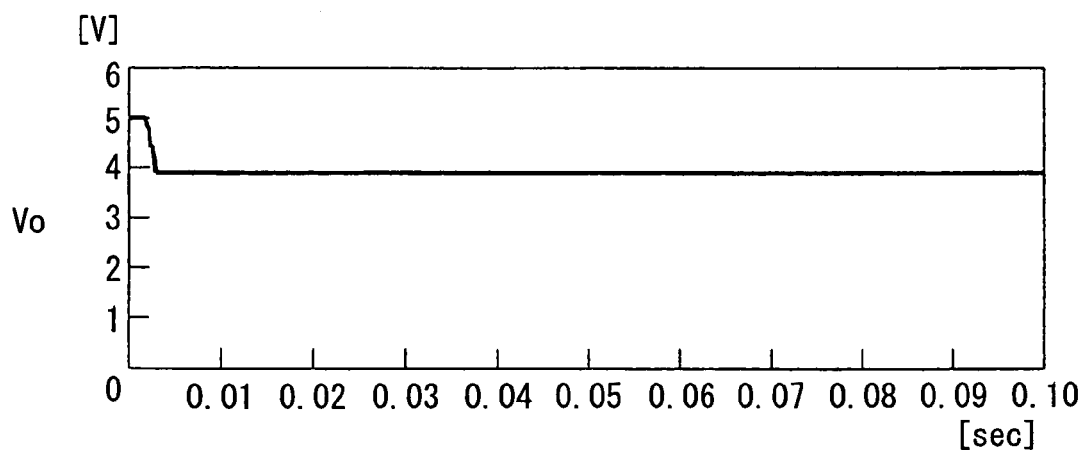
Figure 3C:
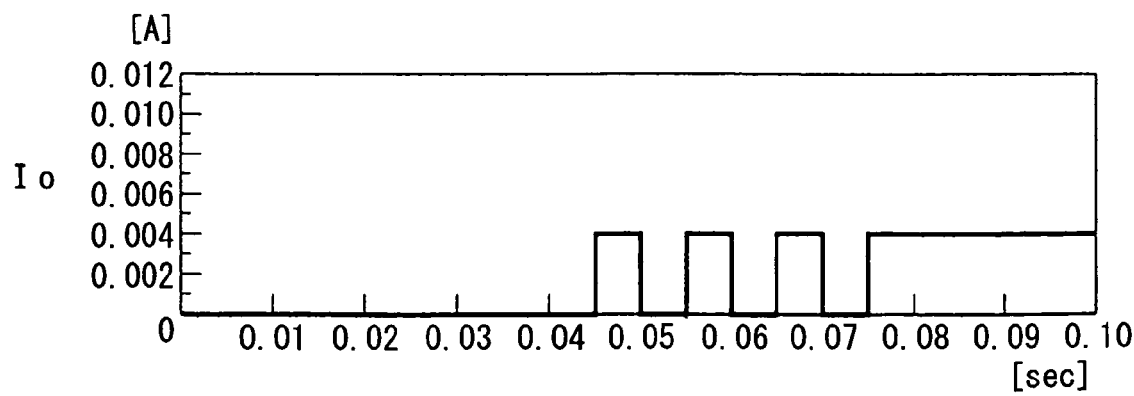
Figure 4A:
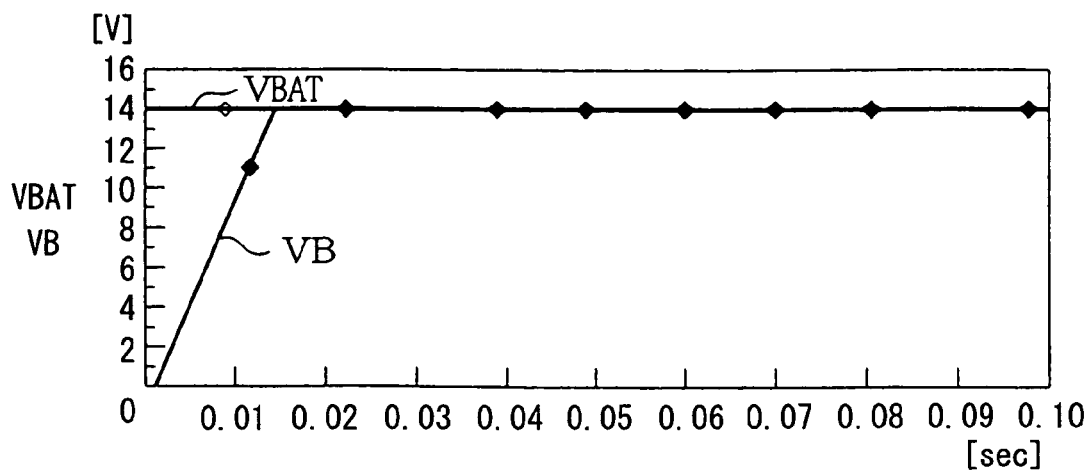
FIGS. 4A-4C are graphs illustrating simulation results of a conventional power supply IC of FIG. 7.
Figure 4B:
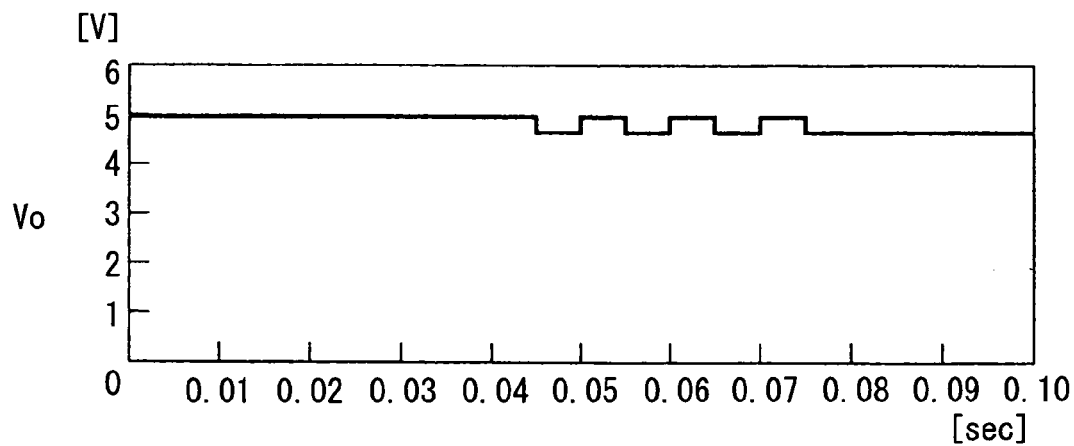
Figure 4C:
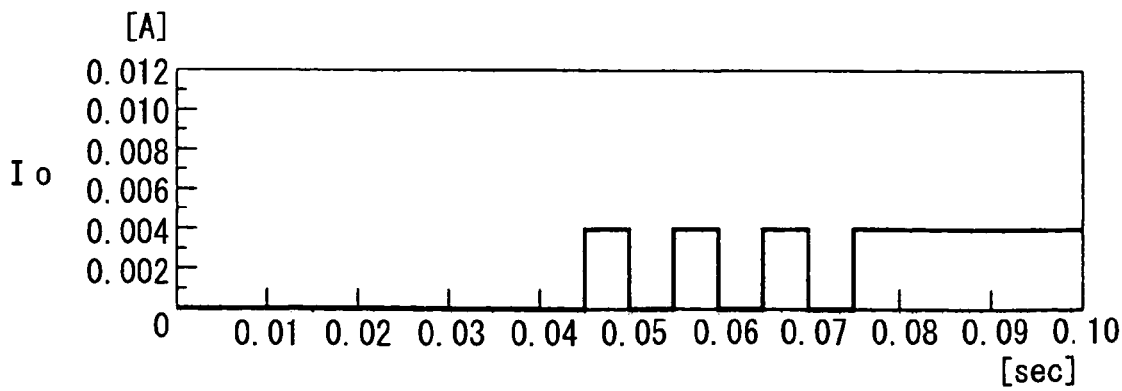

FIGS. 3A-3C show a simulation result of the power supply IC 11 and FIGS. 4A-4C show a simulation result of the conventional power supply IC 1. In the simulation result of the power supply IC 11, the first power supply circuit 15 is set such that the zener voltage Vz minus the forward voltage VF is 5 V when the first power supply circuit 15 operates independently of the second power supply circuit 16. The second power supply circuit 16 is set such that the second power supply circuit 16 outputs a voltage of 3.9 V when the second power supply circuit 16 operates independently of the first power supply circuit 15. The output current Io is temporarily changed to 4 milliamperes (mA) to clarify differences between the power supply IC 11 and the conventional power supply IC 1.

In the power supply IC 11, when the switch 14 is turned on, the battery voltage VB starts to increase. Then, when the second power supply circuit 16 starts to operate and the op-amp 20 starts to perform the feedback control that maintains the output voltage Vo at 3.9 V. As can be seen from FIGS. 3B-3C, even when the output current Io increases to 4 mA, the output voltage Vo is maintained at 3.9 V. The simulation result is the same if the output current Io increases further (i.e., exceeds 4 mA). In contrast, in the conventional power supply IC 1, the output voltage Vo changes with a change in the output current Io because the low-accuracy power supply circuit 2 is open-loop controlled. If the output current Io increases further, the change in the output voltage Vo increases further.

The simulation results show that the power supply IC 11 has excellent voltage output characteristics.

As described above, the power supply IC 11 includes the first power supply circuit 15 having the zener diode D2 and the second power supply circuit 16 having the bandgap reference circuit 7. The first power supply circuit 15 outputs the voltage that depends on the zener voltage Vz generated by the very small current flowing through the zener diode D2. The second power supply circuit 16 outputs the voltage that depends on the reference voltage VBG generated by the bandgap reference circuit 7.

When the switch 14 is in the OFF position, only the first power supply circuit 15 operates. Thus, the current consumed in the power supply IC 11 can be reduced. Therefore, for example, when the vehicle is not used for a long time, the dark current can be reduced.

In contrast, when the switch 14 is in the ON position, each of the first power supply circuit 15 and the second power supply circuit 16 operates. In this case, the output voltages from each of the first power supply circuit 15 and the second power supply circuit 16 are feedback-controlled by the op-amp 20. Thus, the output voltage Vo is constantly maintained at 5 V, regardless of whether the zener voltage Vz minus the forward voltage VF is greater than 5 V.

Thus, the power supply IC 11 is capable of outputting a stable, highly regulated voltage. Further, because there is no need that the zener voltage Vz minus the forward voltage VF is limited below 5 V, the first power supply voltage 15 can be configured such that the zener voltage Vz minus the forward voltage VF is 5 V. Therefore, even when the switch 14 is in the OFF position, the output voltage Vo can be close to 5 V.

Second Embodiment

Figure 5:
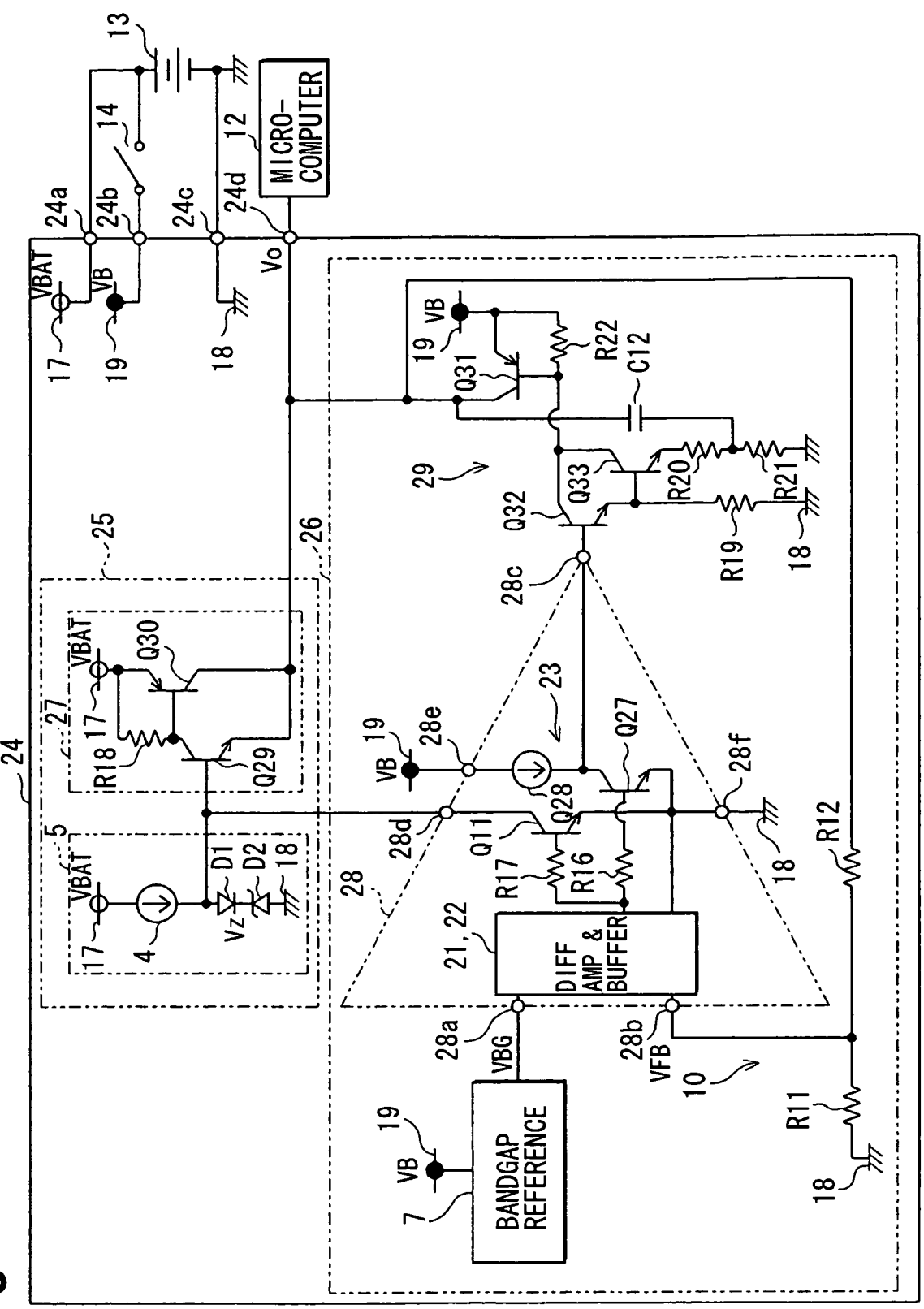
FIG. 5 is a circuit diagram of a power supply IC according to a second embodiment of the present invention.
Figure 6:
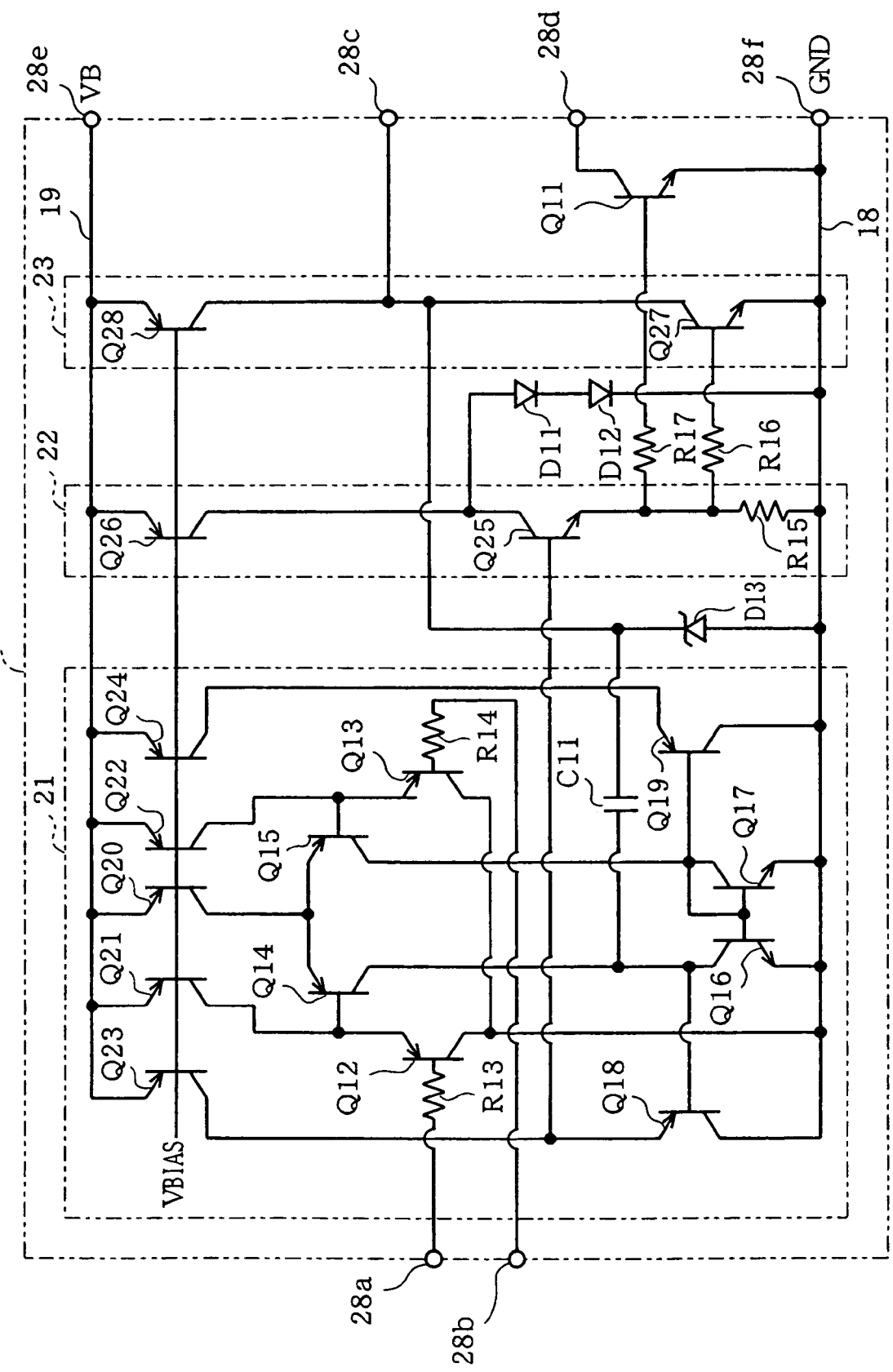
FIG. 6 is a circuit diagram of an operational amplifier used in the power supply IC of FIG. 5.
Figure 7:
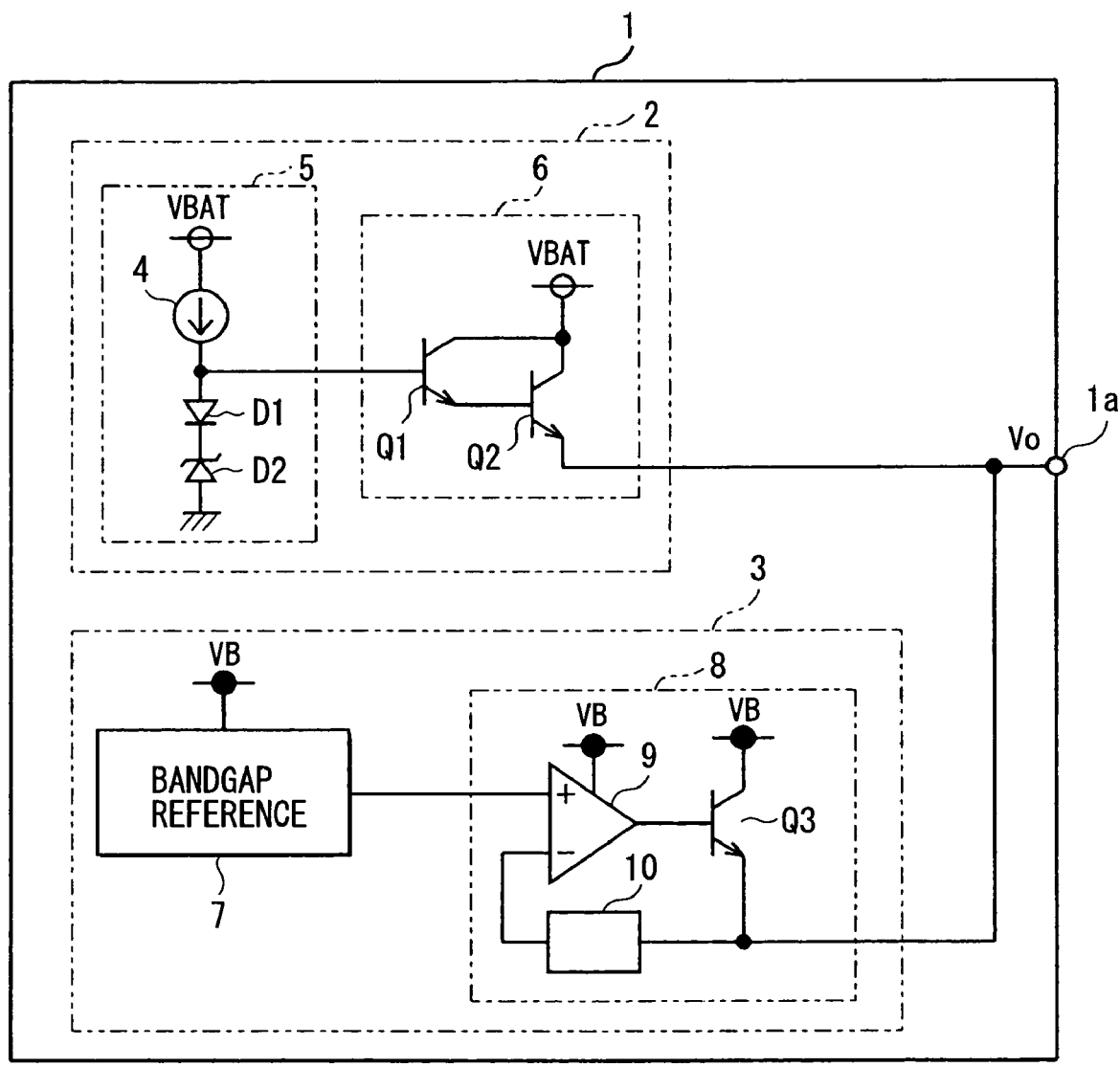
FIG. 7 is a circuit diagram of the conventional power supply IC.

Referring to FIGS. 5 and 6, a power supply IC 24 according to the second embodiment of the present invention is described.

The power supply IC 24 includes a first power supply circuit 25 and a second power supply circuit 26. The power supply IC 24 has terminals 24a-24d corresponding to the terminals 11a-11d of the power supply IC 11.

The first power supply circuit 25 has the voltage generation circuit 5 and an output circuit 27 (as the first output circuit). The output circuit 27 includes a resistor R18 and transistors Q29, Q30 connected in the Darlington configuration. The first power supply circuit 25 operates in the same manner as the first power supply circuit 15 of the power supply IC 11.

The second power supply circuit 26 has the bandgap reference circuit 7, an operational amplifier (op-amp) 28, the feedback circuit 10, a voltage amplifier circuit 29, and a transistor Q31 (as the second output circuit). The transistor Q31 has an emitter connected to the power supply line 19 and a collector connected to the terminal 24d. The op-amp 28 has terminals 28a-28f corresponding to the terminals 20a-20f of the op-amp 20 of the power supply IC 11. As can be seen by comparing FIGS. 2 and 6, a difference between the op-amp 20 and the op-amp 28 is that the op-amp 28 doesn't have the transistor Q3 and the diode D14.

The voltage amplifier circuit 29 includes transistors Q32, Q33, resistors R19-R22, and a phase compensation capacitor C12. The voltage amplifier circuit 29 serves as a phase-inverting amplifier circuit that inverts a voltage of the terminal 28c of the op-amp 28 and supplies the inverted voltage to the base of the transistor Q31. The base of the transistor Q32 is connected to the terminal 28c and the base of the transistor Q33 is connected to the emitter of the transistor Q32. The resistor R19 is connected between the emitter of the transistor Q32 and the ground line 18. The resistors R20, R21 are connected in series between the emitter of the transistor Q33 and the ground line 18. The resistor R22 is connected between the base and the emitter of the transistor Q31. Collectors of the transistors Q32, Q33 are connected to the base of the transistor Q31. The capacitor C12 is connected between the output terminal 24d and a junction of the resistors R20, R21.

Because the second power supply circuit 26 uses the transistor Q31, the voltage amplifier circuit 29 is provided outside the op-amp 28. Thus, the second power supply circuit 26 operates in the same manner as the second power supply circuit 16 of the power supply IC 11.

Therefore, the power supply IC 24 according to the second embodiment has the same excellent voltage output characteristics as the power supply IC 11 according to the first embodiment.

The embodiments described above may be modified in various ways. For example, various types of voltage generation circuits may be used instead of the voltage generation circuit 5 and the bandgap reference circuit 7. The voltage output from the voltage generation circuit 5 may change with a current flowing into the voltage generation circuit 5. In this case, the transistor Q11 as the current sink circuit is replaced with a current source circuit from which the current flows into the voltage generation circuit 5. The buffer circuit 22 and the voltage amplifier circuits 23, 29 may be removed when a stable feedback control is provided without the buffer circuit 22 and the voltage amplifier circuits 23, 29. The emitter follower circuit 6 and the output circuit 27 may be constructed from one transistor instead of the two transistors connected in the Darlington configuration. A metal oxide semiconductor (MOS) transistor may be used instead of the bipolar transistor.

Such changes and modifications are to be understood as being within the scope of the present invention as defined by the appended claims.

What is claimed is:

1. A power supply circuit that is supplied with at least one of a first power supply voltage and a second power supply voltage from an external power source and outputs a desired power supply voltage, the power supply circuit comprising:

an output terminal;

a first power supply circuit that is powered by the first power supply voltage and includes a first voltage generation circuit for outputting a first output voltage that changes with an output current from the first voltage generation circuit and a first output circuit for outputting a second output voltage to the output terminal based on the first output voltage;

a second power supply circuit that is powered by the second power supply voltage and includes a second voltage generation circuit for outputting a third output voltage, a differential amplifier circuit for outputting a fourth output voltage based on a difference between the third output voltage and a feedback voltage from the output terminal, and a second output circuit for outputting a fifth output voltage to the output terminal based on the fourth output voltage; and a current sink circuit into which the output current flows based on the fourth output voltage.

2. The power supply circuit according to claim 1, wherein the first power supply circuit is configured such that the second output voltage approximately equals the desired power supply voltage when the power supply circuit is supplied with only the first power supply voltage, and the second power supply circuit is configured such that the fifth output voltage approximately equals the desired power supply voltage when the power supply circuit is supplied with only the second power supply voltage.

3. The power supply circuit according to claim 1, wherein the second power supply circuit further includes a voltage amplifier circuit connected between an output terminal of the differential amplifier circuit and the second output circuit.

4. The power supply circuit according to claim 1, wherein the first voltage generation circuit has a constant current circuit and a zener diode connected in series with the constant current circuit.

5. The power supply circuit according to claim 1, wherein the second voltage generation circuit is a bandgap reference circuit.

6. The power supply circuit according to claim 1, wherein each of the first and the second output circuits is an emitter follower circuit.

7. The power supply circuit according to claim 1, wherein the first output circuit has at least two transistors that are connected in a Darlington configuration.

* * * * *